United States Patent
Ko et al.

(10) Patent No.: US 9,685,373 B2
(45) Date of Patent: Jun. 20, 2017

(54) CONDUCTIVE PLUG AND METHOD OF FORMING THE SAME

(71) Applicant: MACRONIX International Co., Ltd., Hsinchu (TW)

(72) Inventors: Meng-Tsung Ko, Hsinchu (TW); Yung-Tai Hung, Hsinchu (TW); Chin-Ta Su, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 0 days.

(21) Appl. No.: 14/793,029

(22) Filed: Jul. 7, 2015

(65) Prior Publication Data

US 2017/0011960 A1    Jan. 12, 2017

(51) Int. Cl.
| | |
|---|---|
| *H01L 23/522* | (2006.01) |
| *H01L 23/532* | (2006.01) |
| *H01L 21/768* | (2006.01) |
| *H01L 23/535* | (2006.01) |

(52) U.S. Cl.
CPC .. *H01L 21/76883* (2013.01); *H01L 21/76843* (2013.01); *H01L 23/5226* (2013.01); *H01L 23/535* (2013.01); *H01L 23/53266* (2013.01)

(58) Field of Classification Search
CPC ........... H01L 23/5226; H01L 23/53266; H01L 23/535; H01L 21/76883; H01L 21/76843
USPC ......... 257/751, 758, 774, E23.145, E23.161, 257/E21.495, E21.579; 438/643, 653
See application file for complete search history.

(56) References Cited

U.S. PATENT DOCUMENTS

| | | | | |
|---|---|---|---|---|
| 2005/0118806 A1* | 6/2005 | Koo | ................... | H01L 21/32051 438/685 |
| 2006/0216930 A1* | 9/2006 | Feng | ................... | H01L 21/2885 438/637 |
| 2008/0211098 A1* | 9/2008 | Suzuki | ................ | H01L 21/2885 257/751 |
| 2010/0323517 A1* | 12/2010 | Baker-O'Neal | .. | H01L 21/76873 438/653 |
| 2014/0021633 A1* | 1/2014 | Lee | ....................... | H01L 23/481 257/774 |

* cited by examiner

*Primary Examiner* — Dao H Nguyen
(74) *Attorney, Agent, or Firm* — J.C. Patents

(57) ABSTRACT

A method of forming a conductive plug is disclosed. A material layer having at least one opening is provided on a substrate. A first conductive layer is deposited in the opening, wherein the first conductive layer does not completely fill up the opening. A second conductive layer is deposited on the first conductive layer. A surface treatment is performed after the step of depositing the first conductive layer and before the step of depositing the second conductive layer, so that the first deposition rate of the second conductive layer at the lower portion of the opening is greater the second deposition rate of the second conductive layer at the upper portion of the opening. A void-free conductive plug can be easily formed with the method of the invention.

5 Claims, 5 Drawing Sheets

CONDUCTIVE PLUG AND METHOD OF FORMING THE SAME

BACKGROUND OF THE INVENTION

Field of Invention

The present invention relates to a semiconductor technology, and more particularly to a conductive plug and a method of forming the same.

Description of Related Art

In a typical semiconductor device fabrication, conductive plugs such as vias or contacts are usually provided in a dielectric layer to connect the adjacent horizontal metal layers. As the level of integration of semiconductor devices is continuously increased, the aspect ratio (or height-to-width ratio) of the conductive plugs becomes higher. However, it is rather difficult to fill a metal layer in the high aspect ratio contact or via openings during the step of forming the conductive plugs. Voids are generally observed in the vias or contacts due to the poor metal gap filling property, and the reliability and performance of the device are accordingly affected.

SUMMARY OF THE INVENTION

The present invention provide a conductive plug and a fanning method of the same, in which a void-free conductive plug can be easily formed with the method of the invention.

The present invention provides a method of forming a conductive plug. A material layer having at least one opening is provided on a substrate. A first conductive layer is deposited in the opening, wherein the first conductive layer does not completely fill up the opening. A second conductive layer is deposited on the first conductive layer. A surface treatment is performed after the step of depositing the first conductive layer and before the step of depositing the second conductive layer, so that the first deposition rate of the second conductive layer at the lower portion of the opening is greater than the second deposition rate of the second conductive layer at the upper portion of the opening.

According to an embodiment of the present invention, the surface treatment includes a nitrogen-containing species.

According to an embodiment of the present invention, the nitrogen-containing species includes nitrogen, $NO_2$, $NH_3$, a mixture of nitrogen and hydrogen, or a combination thereof.

According to an embodiment of the present invention, the surface treatment further includes a fluorine-containing species.

According to an embodiment of the present invention, the fluorine-containing species includes $NF_3$.

According to an embodiment of the present invention, each of the first and second conductive layers includes tungsten, titanium or tantalum.

According to an embodiment of the present invention, the first conductive layer includes an untreated portion and a treated portion upon the surface treatment, and the first deposition rate of the second conductive layer on the untreated portion is greater than the second deposition rate of the second conductive layer on the treated portion.

According to an embodiment of the present invention, the method further includes forming a barrier layer before the step of depositing the first conductive layer.

According to an embodiment of the present invention, the opening has an aspect ratio of about 8 or more.

The present invention further provides a method of forming a conductive plug. A material layer having at least one opening is formed on a substrate. A plurality of deposition steps is performed to deposit a plurality of conductive layers in the opening. At least one nitrogen-containing plasma treatment is performed between any two of the deposition steps. Besides, the last deposition step bottom-up deposits the last conductive layer in the opening.

According to an embodiment of the present invention, an i-th conductive layer upon the nitrogen-containing plasma treatment includes an untreated portion and a treated portion, a first deposition rate of an (i+1)th conductive layer on the untreated portion is greater than a second deposition rate of the (i+1)th conductive layer on the treated portion, and i is a positive integer.

According to an embodiment of the present invention, the treated portion includes metal, metal nitride or a combination thereof.

According to an embodiment of the present invention, the gas used in the nitrogen-containing plasma treatment includes nitrogen, $NO_2$, $NH_3$, $NF_3$, a mixture of nitrogen and hydrogen, or a combination thereof.

According to an embodiment of the present invention, each conductive layer includes tungsten, titanium or tantalum.

According to an embodiment of the present invention, the opening has an aspect ratio of about 8 or more.

The present invention also provides a conductive plug including a material layer, a first conductive layer and a second conductive layer. The material layer has at least one opening and is disposed on a substrate. The first conductive layer fills in but not completely fills up the opening. The second conductive layer is disposed on the first conductive layer, wherein the first grain size of the second conductive layer at the lower portion of the opening is different from the second grain size at the upper portion of the opening.

According to an embodiment of the present invention, the first conductive layer includes an untreated portion and a treated portion, and the first grain size of the second conductive layer on the untreated portion is smaller than the second grain size of the second conductive layer on the treated portion.

According to an embodiment of the present invention, each of the first and second conductive layers includes tungsten, titanium or tantalum.

According to an embodiment of the present invention, the conductive plug further includes a barrier layer between the material layer and the first conductive layer.

According to an embodiment of the present invention, the opening has an aspect ratio of about 8 or more.

In view of the above, since a surface treatment is performed between two successive steps of forming conductive layers in the opening, the surface of the former conductive layer is changed so as to affect the deposition rate of the later conductive layer. In such manner, the later conductive layer can be bottom-up deposited in the opening, so the metal gap filling property of the later conductive layer can be significantly improved. Therefore, a void-free conductive plug can be easily formed, and the reliability and performance of the device can be accordingly enhanced.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings

DESCRIPTION OF EMBODIMENTS

Figure 1A:
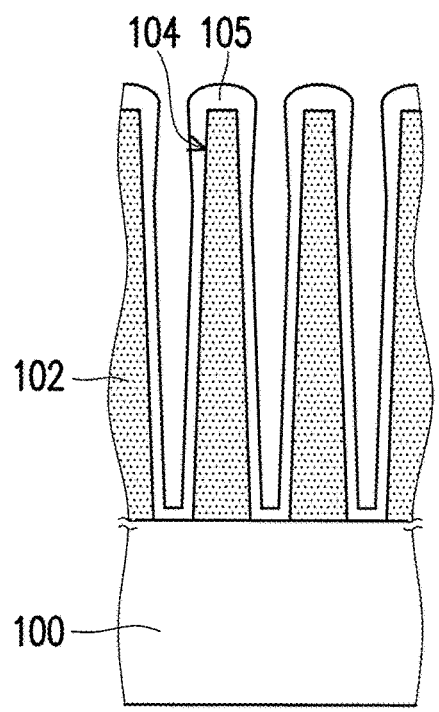
FIG. 1A to FIG. 1F are schematic cross-sectional views of a method of forming a conductive plug according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1A to FIG. 1F are schematic cross-sectional views of a method of forming a conductive plug according to an embodiment of the present invention.

Referring to FIG. 1A, a material layer 102 is provided on a substrate 100. The substrate 100 can be a semiconductor substrate, such as a silicon substrate. The material layer 102 can be a dielectric material layer or an insulation layer, and the material thereof includes tetraethyl orthosilicate $SiO_2$ (TEOS-$SiO_2$), borophosphosilicate glass (BPSG), phosphosilicate glass (PSG), hydrogen silsesquioxane (HSQ), fluorosilicate glass (FSG), undoped silicate glass (USG), silicon nitride (S N), silicon oxynitride (SiON) or a combination thereof.

The material layer 102 has at least one opening 104 therethrough. Besides, each opening 104 has an aspect ratio (or height-to-width ratio) of about 8 or more, about 10 or more or about 12 or more. In an embodiment (not shown), a conductive region such as a doped region can be disposed in the substrate 100 below each opening 104. In another embodiment (not shown), a conductive layer such as a polysilicon layer or a metal layer can be disposed between the material layer 102 and the substrate 100, and each opening 104 exposes a portion of the conductive layer.

In this embodiment, each opening 104 has a tilted sidewall and is made with a wide top and a narrow bottom, as shown in FIG. 1 A, but the present is not limited thereto. In another embodiment, each opening 104 can be shaped in trapezoid with narrow top and wide bottom or can have a substantially vertical sidewall.

Thereafter, a barrier layer 105 is optionally formed in each opening 104. The barrier layer 105 includes refractory metal, refractory metal nitride or a combination thereof. For example, the barrier layer 105 includes titanium (Ti), titanium nitride (TiN), tantalum (Ta), tantalum nitride (TaN) or a combination thereof The method of forming the barrier layer 105 includes performing a suitable deposition process, such as chemical vapour deposition (CVD), physical vapour deposition (PVD) or atomic layer deposition (ALD). In an embodiment, since each opening 104 has a high aspect ratio, the barrier layer 105 is formed thinner at the lower portion but thicker at the upper portion of each opening 104 due to less reaction gas of the barrier layer 105 entering into the opening 104.

Figure 1B:
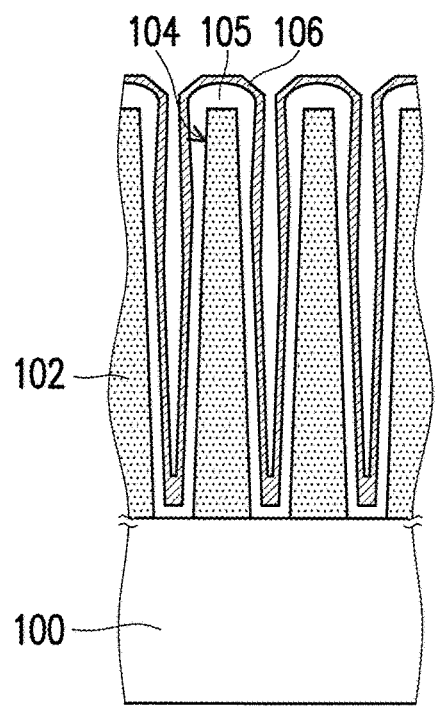

Referring to FIG. 1B, a first conductive layer 106 is formed on the barrier layer 105 in each opening 104. In an embodiment, the first conductive layer 106 does not completely fill up the opening 104. Specifically, the first conductive layer 106 is conformally formed on the sidewall and bottom of each opening 104. The first conductive layer 106 includes metal such as tungsten, and the forming method thereof includes performing a suitable deposition process, such as CVD, PVD or ALD. In an embodiment, the first conductive layer 106 is formed at the substrate temperature of about 250-550° C.

Besides, the first conductive layer 106 has a thickness of about 10 angstroms to 4,000 angstroms. In an embodiment, the thickness of the first conductive layer 106 can be controlled within the range of about 60-80% of half of the opening diameter. Upon the formation of the barrier layer 105 and the first conductive layer 106, each opening 104 has an aspect ratio of greater than about 8, greater than about 10 or greater than about 12.

Figure 1C:
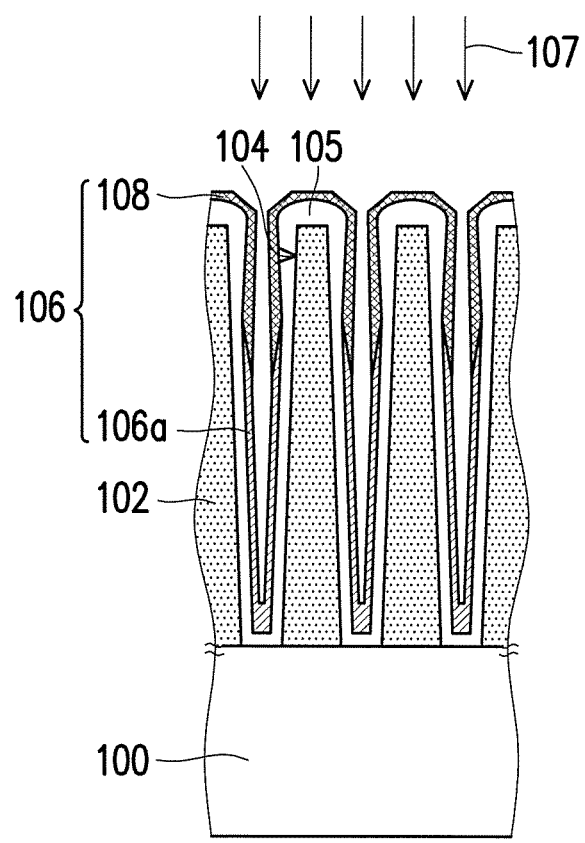

Referring to FIG. 1C, a surface treatment 107 is performed to the first conductive layer 106, for passivating the surface of the first conductive layer 106 and therefore changing the deposition rate of the subsequently formed second conductive layer 110. In an embodiment, the surface treatment 107 includes a nitrogen-containing species as a passivation gas. The nitrogen-containing species includes nitrogen ($N_2$), $NO_2$, $NH_3$, a mixture of nitrogen and hydrogen, or a combination thereof. In an embodiment, when a nitrogen plasma treatment is conducted, the nitrogen plasma power is about 100-5,000 watt, the nitrogen flow is about 100-4,000 sccm, the chamber pressure is about 0.5-10 torr, and the substrate temperature is about 300-600° C.

In an embodiment, the first conductive layer 106 includes an untreated portion 106a and a treated portion 108 upon the surface treatment 107. The untreated portion 106a includes the same material (e.g. tungsten) as that of the first conductive layer 106. The treated portion 108 includes metal, metal nitride or a combination thereof. In an embodiment, the treated portion 108 includes tungsten, tungsten nitride or a combination thereof.

In an embodiment, a surface portion of the first conductive layer 106 is transformed into a metal nitride layer (i.e. treated portion 108) during the surface treatment 107, and the metal nitride layer is formed more at the upper portion but less (or even zero) at the lower portion of each opening 104 due to less passivation gas entering into the opening 104.

In an embodiment, the first conductive layer 106 at the upper portion of each opening 104 is completely transformed into a metal nitride layer (i.e. treated portion 108), and the remaining first conductive layer 106 (i.e. untreated portion 106a) and the metal nitride layer (i.e. treated portion 108) has a substantially smooth interface therebetween, as shown in FIG. 1C. However, the present invention is not limited thereto. In another embodiment (not shown), the first conductive layer 106 at the upper portion of each opening 104 is partially transformed into a metal nitride layer, and the untransformed portion of the first conductive layer 106 remains between the metal nitride layer and the barrier layer 105 at the upper portion of each opening 104.

In another embodiment, the passivation gas is merely adsorbed on the surface of the first conductive layer 106 without generating a metal nitride layer. That is, the untreated portion 106a and the treated portion 108 includes the same material, such as tungsten. The passivation gas is adsorbed more at the upper portion but less (or even zero) at the lower portion of each opening 104 due to less passivation gas entering into the opening 104. The more the passivation gas is adsorbed on the first conductive layer 106, the less the subsequently formed second conductive layer 110 is deposited on the same.

In addition to the nitrogen-containing species as a passivation gas, a fluorine-containing species as an etching gas can be further included in the surface treatment 107. The fluorine-containing species includes $NF_3$, $CF_4$, $C_2F_6$, $C_4F_8$, SF$_6$ or a combination thereof. The treated portion 108 of the first conductive layer 106 at the top corner of each opening 104 can be rounded by the fluorine-containing species, so the subsequently formed second conductive layer 110 can fill in the opening 104 more easily than the case without using a fluorine-containing species. In an embodiment, the nitrogen-containing species and the fluorine-containing species are in the range of 40-100 sccm and 15-30 sccm, respectively.

In this embodiment, the surface treatment 107 includes an anisotropic plasma treatment, but the present invention is not limited thereto. In another embodiment, the surface treatment 107 can be a rapid thermal annealing (RTP) process, an ion implantation step or a wet-chemical treatment.

Figure 1D:
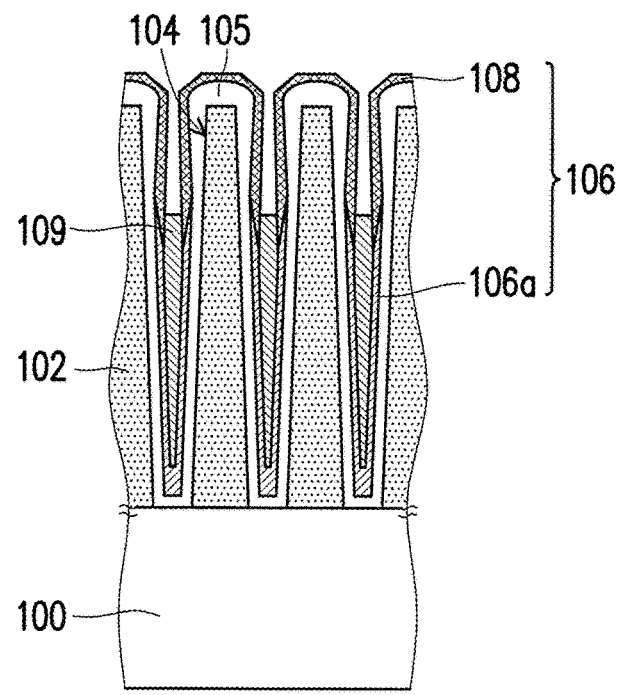
Figure 1E:
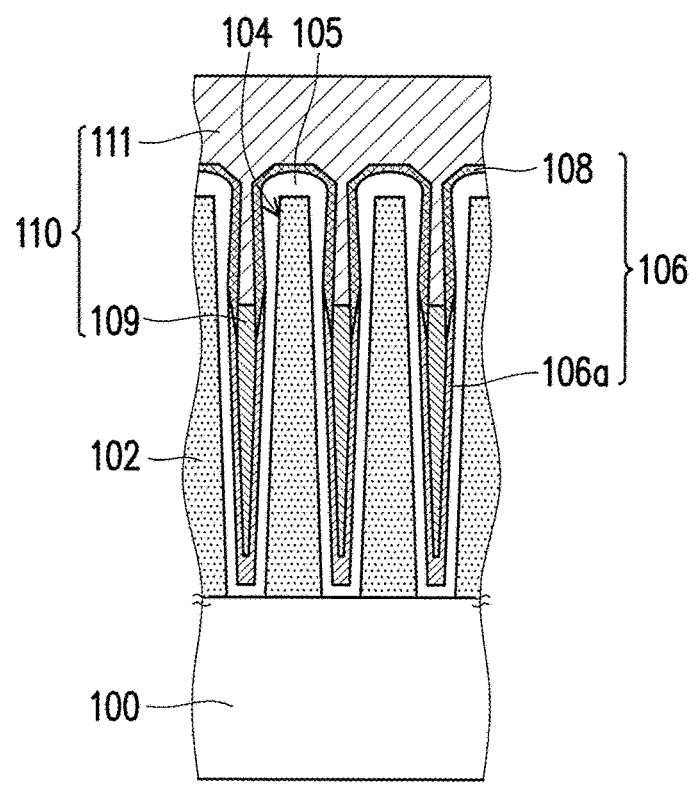

Referring to FIG. 1D and FIG. 1E, a second conductive layer 110 is formed on the first conductive layer 106 in each opening 104. The second conductive layer 110 includes metal such as tungsten, and the forming method thereof includes performing a suitable deposition process, such as CVD, PVD or ALD. Besides, the second conductive layer 110 has a thickness of about 10 angstroms to 10,000 angstroms. In this embodiment, the first conductive layer 106 includes the same material as that of the second conductive layer 110, but the present invention is not limited thereto. In another embodiment, the first and second conductive layers 106 and 110 can include different materials.

It is noted that the surface treatment 107 of the invention plays an important role in changing the deposition rate of the second conductive layer 110. As shown in FIGS. 1D and 1E, the untreated portion 106a of the first conductive layer 106 functions as a seeding layer, so the second conductive layer 110 can be bottom-up deposited in each opening 104. That is, the lower portion of each opening 104 is filled with the first part 109 of the second conductive layer 110 (as shown in FIG. 1D), and the upper portion of each opening 104 is then filled with the second part 111 of the second conductive layer 110 (as shown in FIG. 1E). The second part 111 of the second conductive layer 110 is further deposited to cover the tops of the treated portion 108 of the first conductive layer 106.

In other words, the first conductive layer 106 includes the untreated portion 106a and the treated portion 108 upon the surface treatment 107, and the first deposition rate of the first part 109 of the second conductive layer 110 on the untreated portion 106a is greater than the second deposition rate of the second part 111 of the second conductive layer 110 on the treated portion 108.

The deposition rate of the second conductive layer 110 can also be controlled by the substrate temperature (e.g. 250-550° C). Therefore, in addition to the surface treatment 107, the substrate temperature can be set properly for further changing the deposition rate of the second conductive layer 110. For example, the substrate temperature can be set in a range of about 250-550° C. in the step of FIG. 1D, and the substrate temperature can be set in a range of about 250-550° C. in the step of FIG. 1E.

Figure 2:
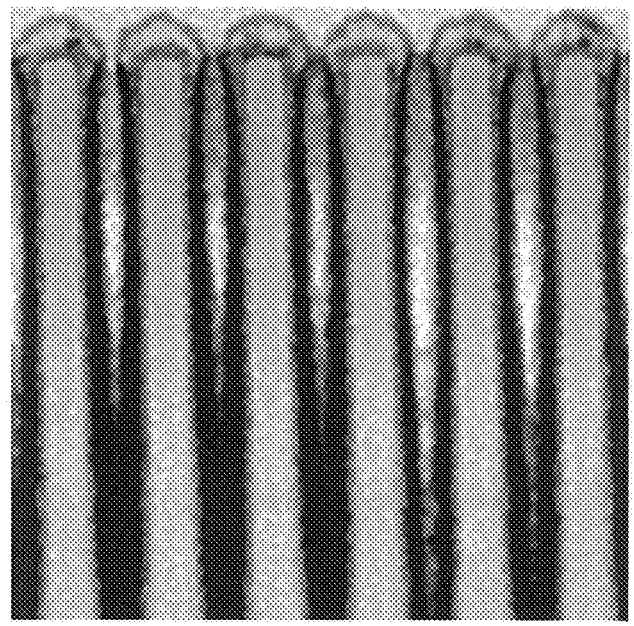
FIG. 2 is a SEM image of FIG. 1D.
Figure 3:
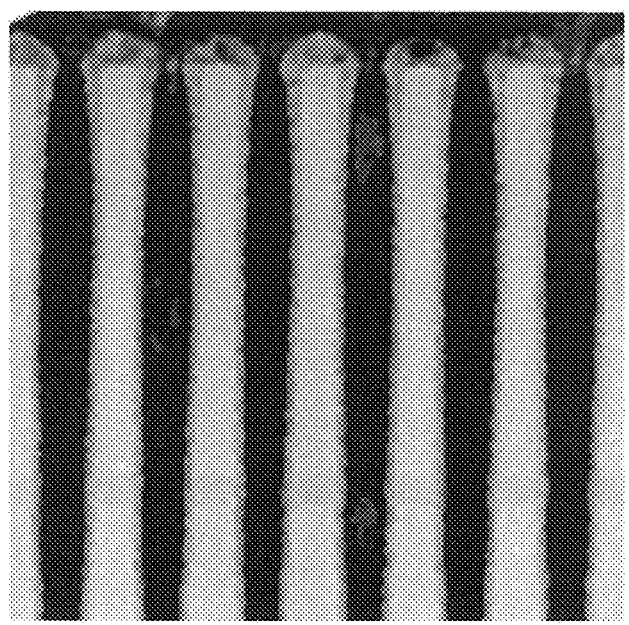
FIG. 3 is a SEM image of FIG. 1E.

Since the second conductive layer 110 is bottom-up deposited in each opening 104, the metal gap filling property can be significantly improved, and therefore, voids are not observed during the deposition step of the second conductive layer 110, as shown in SEM images of FIGS. 2 and 3 respectively taken in steps of FIGS. 1D and 1E.

Figure 1F:
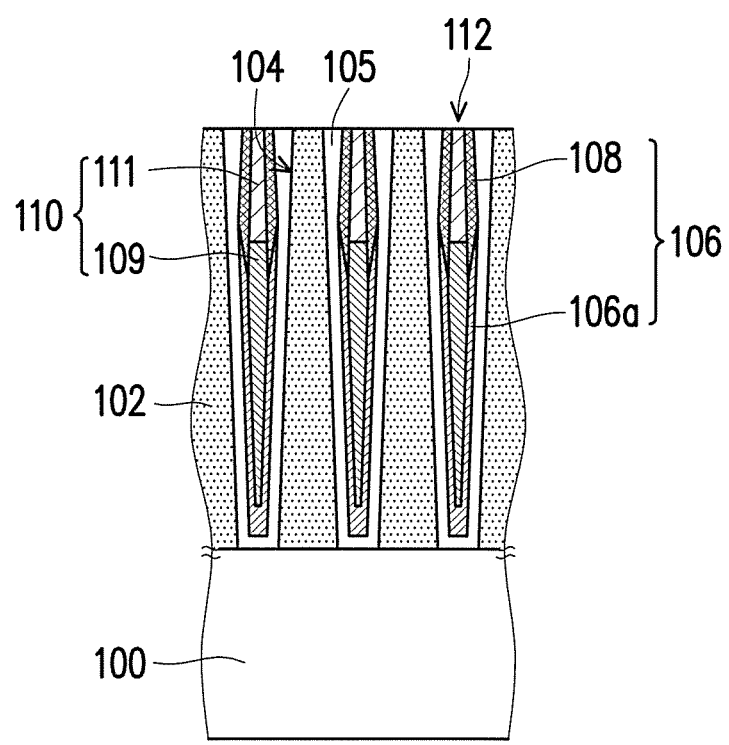

Referring to FIG. 1F, the excessive layers outside the openings 104 are removed until the top surface of the material layer 102 exposed, and thus, a void-free conductive plug 112 is formed in each opening 104. The removing step includes performing a chemical mechanical polishing (CMP) process or an etching back process.

The steps in FIG. 1A to FIG. 1F can be performed in sequence at different chambers or in-situ in the same chamber.

In the said embodiment, the conductive plug 112 is a tungsten plug, so a diffusion barrier layer 105 of Ti/TiN or Ta/TaN is required to form before the formation of the tungsten plug. However, the present invention is not limited thereto. In another embodiment, when the conductive plug 112 is a titanium plug or a tantalum plug, the step of forming the barrier layer can be omitted.

The said embodiment in which two metal deposition steps and one surface treatment step between the metal deposition steps are conducted to form a void-free conductive plug is provided for illustration purposes, and is not construed as limiting the present invention. In other words, the number of the deposition steps or the surface treatment steps are not limited by the said embodiment.

Specifically, the present invention further provides a method of forming a conductive plug. First, a material layer having at least one opening is provided on a substrate, and the opening has an aspect ratio of about 8 or more. Thereafter, multiple deposition steps are performed to deposit multiple conductive layers in the opening. Afterwards, at least one nitrogen-containing plasma treatment is performed between any two of the deposition steps. Besides, the gas used in each nitrogen-containing plasma treatment includes a passivation gas (e.g. nitrogen, NO$_2$, NH$_3$, a mixture of nitrogen and hydrogen, or a combination thereof) and an optional etching gas (e.g. NF$_3$).

For example, in the case that first, second and third deposition steps are performed, one nitrogen-containing plasma treatment can be conducted between the first and second deposition steps, and another nitrogen-containing plasma treatment can be conducted between the second and third deposition steps. The first and second deposition steps respectively form first and second conductive layers, each of which does not completely fill up the opening. The third deposition step (i.e. the last deposition step) bottom-up deposits a third conductive layer (i.e. the last conductive layer) in the opening.

As discussed above, the surface treatment (such as a nitrogen-containing plasma treatment) of the invention performed to the former conductive layer plays an important role in changing the deposition rate of the later conductive layer. Specifically, the i-th conductive layer upon the nitrogen-containing plasma treatment includes an untreated portion and a treated portion, the first deposition rate of the (i+1)-th conductive layer on the untreated portion is greater than the second deposition rate of the (i+1)-th conductive layer on the treated portion, and i is a positive integer. The untreated portion includes metal. The treated portion includes metal, metal nitride or a combination thereof.

The conductive plug structure of the present invention is illustrated with reference to FIG. 1F in the following. As shown in FIG. 1F, the conductive plug 112 includes a material layer 102, a first conductive layer 106 and a second conductive layer 110. The material layer 102 has at least one opening 104 therein and is disposed on a substrate 100. Each opening 104 has an aspect ratio of about 8 or more. The first conductive layer 106 fills in but not completely fills up the opening 104. The second conductive layer 110 is disposed on the first conductive layer 106.

Besides, each of the first and second conductive layers 106 and 110 includes tungsten, titanium or tantalum. In an embodiment, the conductive plug 112 further includes a barrier layer 105 disposed between the material layer 102 and the first conductive layer 106.

It is noted that the first grain size of the second conductive layer 110 at the lower portion of each opening 104 is different from the second grain size at the upper portion of each opening 104. In an embodiment, the first conductive layer 106 includes an untreated portion 106a and a treated portion 108, and the first grain size of the first part 109 of the second conductive layer 110 on the untreated portion 106a is smaller than the second grain size of the second part 111 of the second conductive layer 110 on the treated portion 108.

Specifically, since the deposition rate of the second conductive layer 110 at the lower portion is greater than that at the upper portion of each opening 104, so the second conductive layer 110 grows faster at the lower portion than at the upper portion, and thus, the first grain size of the second conductive layer 110 at the lower portion of each opening 104 is smaller than the second grain size of the second conductive layer 110 at the upper portion of each opening 104.

In summary, in the method of the invention, since a surface treatment is performed between two successive steps of forming conductive layers in the opening, the surface of the former conductive layer is changed so as to affect the deposition rate of the later conductive layer. In such manner, the later conductive layer can be bottom-up deposited in the opening, so the metal gap filling property of the later conductive layer can be significantly improved. Therefore, a void-free conductive plug can be easily formed, and the reliability and performance of the device can be accordingly enhanced.

Besides, in the conventional method, due to the poor metal gap filling property, an extra barrier etching step is usually conducted for enlarging the dimension of the upper opening before the tungsten CVD step. Also, when the opening has an aspect ratio of about 8 or more, such barrier etching step is not enough to prevent formation of voids during the tungsten CVD step. However, the extra barrier etching step is not required in the invention and a void-free tungsten plug can be easily formed with few simple steps. In other words, the method of the invention is competitive, and process window is greater for mass production.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. A conductive plug, comprising:
   a material layer having at least one opening, disposed on a substrate;
   a first conductive layer, filling in but not completely filling up the opening, wherein the first conductive layer comprises an untreated portion and a treated portion, and the untreated portion covers a bottom surface and a lower portion of a sidewall of the opening; and
   a second conductive layer, disposed on the first conductive layer, wherein a first grain size of the second conductive layer at a lower portion of the opening is different from a second grain size at an upper portion of the opening.

2. The conductive plug of claim 1, wherein the first grain size of the second conductive layer on the untreated portion is smaller than the second grain size of the second conductive layer on the treated portion.

3. The conductive plug of claim 1, wherein each of the first and second conductive layers comprises tungsten, titanium or tantalum.

4. The conductive plug of claim 1, further comprising a conductive barrier layer between the material layer and the first conductive layer.

5. The conductive plug of claim 1, wherein the opening has an aspect ratio of about 8 or more.

* * * * *